(12) United States Patent
Li

(10) Patent No.: US 11,177,141 B2
(45) Date of Patent: Nov. 16, 2021

(54) METHOD FOR PACKAGING A CHIP

(71) Applicant: JWL (Zhejiang) Semiconductor Co., Ltd, Huzhou (CN)

(72) Inventor: Linping Li, Hangzhou (CN)

(73) Assignee: JWL (Zhejiang) Semiconductor Co., Ltd, Huzhou (CN)

( * ) Notice: Subject to any disclaimer, the term of this patent is extended or adjusted under 35 U.S.C. 154(b) by 0 days.

(21) Appl. No.: 16/925,329

(22) Filed: Jul. 9, 2020

(65) Prior Publication Data
US 2020/0343109 A1 Oct. 29, 2020

(30) Foreign Application Priority Data
Aug. 28, 2019 (CN) .......................... 201910801551.0

(51) Int. Cl.
| | |
|---|---|
| H01L 27/146 | (2006.01) |
| H01L 21/56 | (2006.01) |
| H01L 23/00 | (2006.01) |
| H03H 3/02 | (2006.01) |
| H03H 9/15 | (2006.01) |
| H03H 9/54 | (2006.01) |

(52) U.S. Cl.
CPC .............. *H01L 21/56* (2013.01); *H01L 24/16* (2013.01); *H01L 24/81* (2013.01); *H03H 3/02* (2013.01); *H03H 9/15* (2013.01); *H03H 9/54* (2013.01); *H01L 2224/16227* (2013.01); *H01L 2224/81815* (2013.01); *H01L 2224/81951* (2013.01); *H01L 2924/1421* (2013.01); *H01L 2924/1461* (2013.01)

(58) Field of Classification Search
CPC ......... H01L 21/56; H01L 24/16; H01L 24/81; H03H 3/02; H03H 9/15; H03H 9/54
USPC ......................................................... 333/186
See application file for complete search history.

(56) References Cited

U.S. PATENT DOCUMENTS

| | | | |
|---|---|---|---|
| 2015/0171064 A1* | 6/2015 | Tan ......................... | H01L 24/81 361/783 |
| 2018/0374790 A1* | 12/2018 | Chang ................... | H01L 23/145 |

\* cited by examiner

*Primary Examiner* — Ori Nadav

(57) ABSTRACT

A method for packaging a chip and a chip package structure are provided. The method is used to package the chip including an acoustic filter. The packaging substrate and the device wafer are welded together, wherein the edge of the device wafer is chamfered, the packaging substrate is provided with a groove, the chamfered portion of device wafer is aligned with the groove on the substrate, and then a mask is disposed. The surface of the mask facing the device wafer is an inclined surface, forming a wedge-shaped opening. A package resin material is printed, wherein the package resin material falls into the groove through the inclined surface of the mask, and a package resin film is formed between the groove and the chamfer. The mask is removed along the first surface toward the second surface. The package resin is cured in a position where the resin film is located.

6 Claims, 9 Drawing Sheets

METHOD FOR PACKAGING A CHIP

BACKGROUND OF THE INVENTION

Field of the Invention

This invention relates to the technical field of semiconductor device manufacturing, particularly for a method for packaging a chip and a chip package structure thereof regarding acoustic RF filter devices and MEMS devices.

Description of Related Art

The acoustic filter chip is designed using the principle of surface acoustic wave or bulk acoustic wave. During package, an air cavity must be formed without any medium contact on resonant circuit area to ensure that the sound waves will not be conducted and dissipated, and that the sound wave is resonated according to the designed mode to obtain the desired frequency output. Therefore, when all acoustic filter chips are packaged, a cavity is required for the resonance unit side.

However, whether the WLP (wafer-level package) process or the resin film package process (as FIG. 1) is used for package in the prior art, there are corresponding disadvantages. For example, the cost of WLP wafer bonding package process is higher, and the chip size obtained by resin film package process is larger.

How to provide a new package method and package structure for making the dimension close to the chip obtained by wafer-level package while the cost being much lower than that of wafer-level package or for making dimension smaller than that of the chip obtained by film package while the cost being relatively close has become an urgent problem to be solved.

SUMMARY OF THE INVENTION

In view of this, a method for packaging a chip and a chip package structure are proposed in this invention. The chip includes an acoustic filter, as to solve the problem that the acoustic filter chip package with prior art which cannot be made compact and cost-effective at the same time.

To achieve the above purpose, the technical solution of this invention is implemented as follows.

A method for packaging a chip is provided, the chip including an acoustic filter. The method includes the following steps:

providing a device wafer, wherein the device wafer includes a first surface and a second surface that are disposed oppositely, the first surface of the device wafer is formed with a resonance circuit and electrical pads of the acoustic filter, and an edge of the acoustic filter is chamfered;

providing a packaging substrate, wherein the packaging substrate includes a third surface and a fourth surface that are disposed oppositely, and the third surface of the packaging substrate is formed with a groove and a soldering opening;

mounting the first surface of the device wafer opposite to the third surface of the packaging substrate, and soldering the soldering opening with the electrical pads, so that the groove is aligned with the chamfered portion;

providing a mask for printing, wherein the mask is embedded around the device wafer, and a side wall of the mask is a surface inclined relative to a side wall of the device wafer, the side wall of the mask is gradually away from the device wafer along the first surface toward to the second surface; a closest distance between the side wall of the mask and the side wall of the device wafer is greater than or equal to 0 and less than 5 μm;

printing a package resin material, wherein the package resin material falls into the groove through the inclined surface of the mask, and a package resin is formed between the groove and the chamfer;

removing the mask along the first surface toward to the second surface, wherein the mask separates excess package resins from the side wall of the device wafer, the remaining package resins form a resin film between the chamfer and the groove, and a cavity is formed among the resin film, the device wafer and the packaging substrate;

curing the package resin in a position where the resin film is located; and molding on the second surface of the device wafer, the side wall of the device wafer and a surface of the resin film facing away from the cavity, to form a closed package case.

In one embodiment, the step of providing a device wafer includes:

providing a device wafer substrate;

fabricating multiple acoustic filter units on a surface of the device wafer substrate, each of the acoustic filter units comprising resonance circuits and electrical pads;

etching a cutting groove around each of the acoustic filter units, the cutting groove being wider than a dicing blade; and dicing the device wafer substrate into a single device wafer (individual chip/die) along the cutting groove, an edge of a surface of the single device wafer provided with the resonance circuits being chamfered.

In one embodiment, the method further includes:

forming a passivation layer on the electrical pads; and etching the passivation layer, and forming an opening on the electrical pads for receiving a solder paste in a soldering process, so that the electrical pads of the device wafer is automatically aligned with the soldering opening of the packaging substrate according to a target position to avoid the flow of the solder paste.

In one embodiment, the package resin is a UV-curable resin material with a viscosity at room temperature ranging from 250 pa·s to 800 pa·s, including endpoint values.

In one embodiment, the step of curing the package resin in a position where the resin film is located includes: curing the package resin in a position where the resin film is located using a UV light.

In one embodiment, molding on the second surface of the device wafer, the side wall of device wafer, and a surface of the resin film facing away from the cavity, includes:

providing a liquid molding material;

setting a molding pressure range to 15 Bar to 25 Bar, and a temperature range to 145° C. to 155° C.; and molding on the second surface of the device wafer, the side wall of the device wafer and a surface of the resin film facing away from the cavity.

Another object of this invention is to provide a chip package structure.

To achieve the above purpose, the technical solution of this invention is implemented as follows.

The chip package structure includes an acoustic filter structure, and includes:

a packaging substrate and a device wafer that are opposite, spaced apart and electrically connected with each other, wherein a surface of the device wafer toward to a surface of the packaging substrate is provided with a resonance circuit;

a surface of the packaging substrate toward to the surface of the device wafer is provided with a groove, and a projection edge of the groove corresponds to a projection edge of the device wafer on the packaging substrate;

an edge of the device wafer is chamfered; and a resin film for closing a spacing between the packaging substrate and the device wafer is provided between the groove and the chamfer, and the resin film, the device wafer and the packaging substrate constitute a cavity;

wherein a surface of the device wafer facing away from the packaging substrate, a sidewall of the device wafer, a surface of the resin film facing away from the cavity, and the package of the packaging substrate are encapsulated together.

In one embodiment, the packaging substrate and the device wafer are spaced apart and electrically connected with each other by soldering.

In one embodiment, a thickness of the resin film ranges from 5 µm to 30 µm, including endpoint values.

In one embodiment, a thickness of a side wall of the package that is formed by the resin film after being cured ranges from 50 µm to 100 µm, including endpoint values.

In one embodiment, the chip package structure is a system in package module comprising an acoustic filter, and the system in package module further comprises a switch, a low noise amplifier or a power amplifier.

According to the above technical solution, the method for packaging a chip provided in this invention is used to package a chip including an acoustic filter, including: soldering a packaging substrate to a device wafer first, wherein an edge of the device wafer is chamfered, the packaging substrate is provided with a groove, the chamfered portion is aligned with the groove on the packaging substrate, and then a mask for printing is provided, a surface of the mask facing the device wafer being an inclined surface to forming a wedge-shaped opening; printing a package resin material, wherein the package resin material is filled between the chamfer and the groove, then the mask is removed a direction away from the packaging structure, the excess package resin material is removed from the device wafer through a region with smaller opening of the wedge-shaped opening of the mask, and then the remaining package resin material is cured, and finally a resin film is formed between the device wafer and the packaging substrate and a cavity for the acoustic filter is formed among the resin film, the device wafer and the packaging substrate, followed by forming a packaging through molding, thereby completing the package of the acoustic filter chip. The resin film has a smaller thickness, and the packaging may provide higher performance protection inside the package.

Due to the chip structure including an acoustic filter formed by the above package method, the packaging substrate and the device wafer are connected by a resin film to form a cavity, and the resin film has a smaller thickness, which exerts effect on the dimension of the device wafer and the packaging substrate, so that the dimension of the wafer wafer-level package may be reached; at the same time, since the resin film is formed by printing, no complicated photolithography process or wafer bonding plus TSV process is required, and the device wafer does not need to be ball-mounted, so that the cost is greatly reduced while the cost is similar to that for the resin film package. Therefore, the chip obtained by the packaging method provided in this invention meets the requirements of small size, but also has the characteristics of lower cost, and has both small size and low cost.

BRIEF DESCRIPTION OF THE DRAWINGS

Aspects of the invention are best understood from the following detailed description when read with the accompanying figures. The exemplary embodiments of the invention and the description thereof are used to explain the invention, and do not constitute improper limitations on the preset invention. In the drawings.

DESCRIPTION OF THE PREFERRED EMBODIMENTS

Technical solutions in the embodiments of this invention will be clearly and completely described hereafter with reference to the accompanying drawings in the embodiments of this invention. Apparently, the described embodiments are only some of the embodiments of this invention, but not all the embodiments. On the basis of the embodiments in this invention, all the other embodiments obtained by a person skilled in the art without involving an inventive effort are all concluded in the protection scope of this invention.

Figure 1:
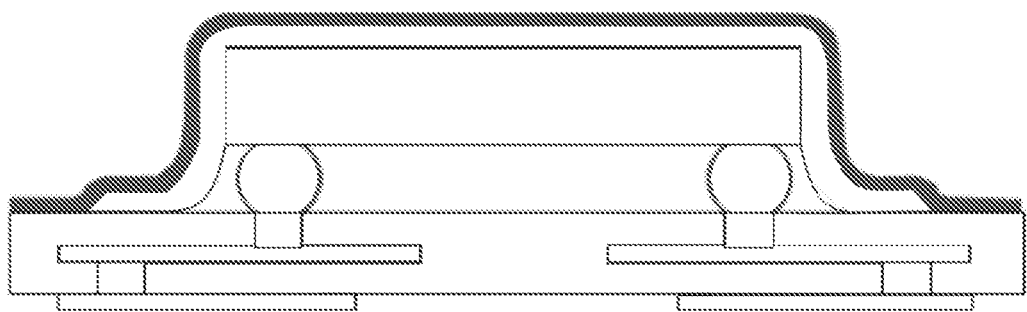
FIG. 1 is a diagram of a chip with resin film package structure obtained by a prior art which realized by film molding process.

As described in Background, the acoustic filter chip package in the prior art usually uses a wafer-level package process or a film-forming process to form a chip package structure. However, the wafer-level package process usually requires a complex lithography process or wafer bonding plus TSV process, resulting in higher cost of wafer-level package. And for the film-forming process, generally, the device wafer is first mounted on the packaging substrate, and the entire resin film is heated and pressed onto the packaging substrate, wherein the resin film itself is very thin, but a large distance is required at the edge of the device wafer to ensure the reliability after the resin film molded, and it cannot be disconnected on the surface next to the side wall of the device wafer, as shown in FIG. 1, thereby causing a larger dimension for the finally chip packaging.

On this basis, an embodiment of this invention provides a chip packaging method, wherein the chip includes an acoustic filter, and the acoustic filter is provided with a cavity structure for the resonance circuit side. The acoustic filter may be a surface acoustic wave (SAW) acoustic filter or a bulk acoustic wave (BAW) acoustic filter, which is not a limitation in this embodiment, and the chip package method provided in this embodiment is applicable.

Figure 2:
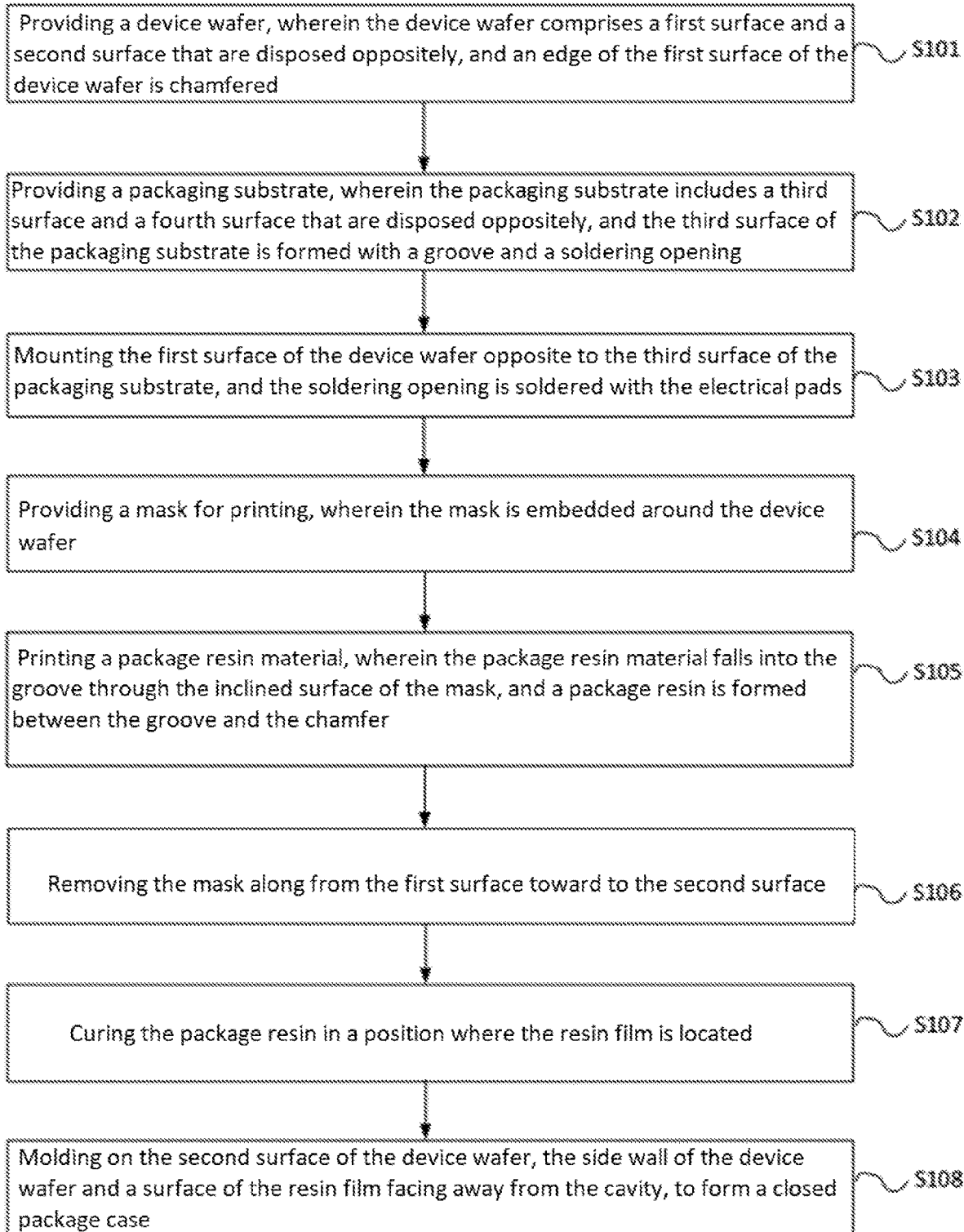
FIG. 2 is a flowchart of a method for packaging a chip according to an embodiment of this invention.

With reference to FIG. 2, FIG. 2 is a flowchart of a method for packaging a chip according to an embodiment of this invention. The method includes:

S101: providing a device wafer, wherein the device wafer comprises a first surface and a second surface that are disposed oppositely, the first surface of the device wafer is formed with a resonance circuit and electrical pads of the acoustic filter, and an edge of the first surface of the device wafer is chamfered.

Figure 3:
FIGS. 3-16 are process cross-sectional views corresponding to the process flow of the method for packaging a chip according to an embodiment of this invention.

With reference to FIG. 3, FIG. 3 is a cross-sectional view of a device wafer. The device wafer includes a first surface and a second surface that are disposed oppositely, wherein the first surface is an upper surface in FIG. 3, and the second surface is a lower surface in FIG. 3, which are not labeled with numbers in this embodiment. The first surface of the device wafer 1 is formed with a resonance circuit 11 and electrical pads 12 of the acoustic filter. It should be noted that before cutting the device wafer, the acoustic filter units 10 arranged as array are usually arranged on the device wafer, thereby achieving mass production. The acoustic filter units 10 include the resonance circuit 11 and the electrical pads 12.

Figure 4:

It should be noted that an edge of the first surface of the device wafer is chamfered, and specific manufacturing processes for the device wafer are not limited in this embodiment, which may include:

providing a device wafer substrate; and fabricating a plurality of acoustic filter units on a surface of the device wafer substrate, each of the acoustic filter units including resonance circuits and electrical pads, with reference to FIGS. 3 and 4.

It should be noted that in order to prevent the solder paste from flowing during subsequent soldering of the device wafer and the packaging substrate, the wafer manufacturing process provided in this embodiment further includes: forming a passivation layer on the electrical pads 12, and etching the passivation layer, and forming an opening 2 on the electrical pads for receiving a solder paste in a soldering process to prevent the solder paste from flowing.

By processing the passivation layer, an SMD (solder mask defined) structure is formed in the electrical pads area, so as to ensure that the solder paste is in contact to complete the soldering during the subsequent mounting and soldering process. It should be noted that preferably, in this embodiment, an area of the electrical pads surrounded by the opening 2 is 100 μm*100 μm to 200 μm*200 μm, wherein a larger area may ensure the reliability of the SMD structure and the low stress inside the device after packaging to ensure that the subsequent solder joints have better Anti-fatigue performance.

Figure 5:
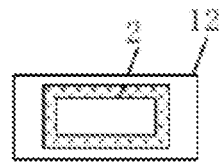
Figure 6:
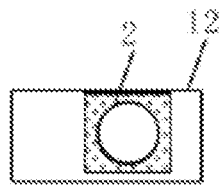

In this embodiment, the structure of the opening is not limited. As shown in FIGS. 5 and 6, a top structural view of region A in FIG. 4 is illustrated, and the opening 2 is provided on the electrical pads 12, wherein the opening 2 may be a square region as shown in FIG. 5 or a circle region as shown in FIG. 6, which is not limited in this embodiment.

A cutting groove is etched around each of the acoustic filter units, the cutting groove being wider than a dicing blade.

The dicing blade is used to dice the device wafer substrate into a single device wafer along the cutting groove, an edge of a surface of the device wafer provided with the resonance circuit being chamfered.

Figure 7:
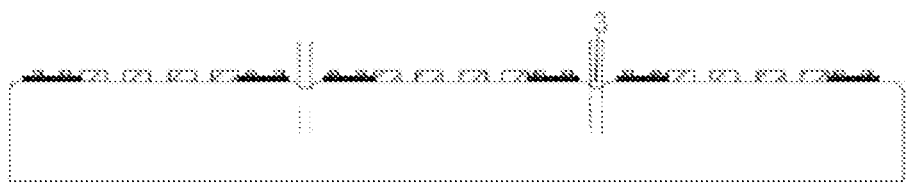
Figure 8:
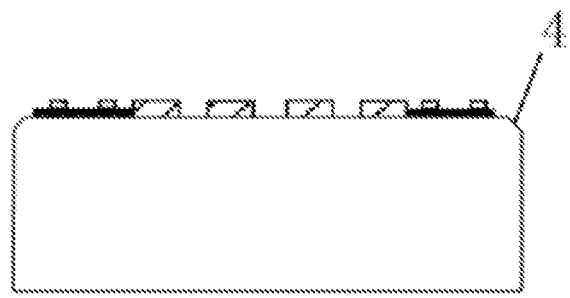

As shown in FIG. 7, a cutting groove 3 is etched around each of the acoustic filter units, wherein the cutting groove is wider than a dicing blade, and the cutting groove is a groove with a large opening and an inclined side wall, so that after cutting, the edge of each device wafer may be chamfered. As shown in FIG. 8, a structural view of a single device wafer is illustrated, and a chamfer 4 is formed on an edge of the first surface of the device wafer, i.e., on an edge of the surface wherein forming the resonance circuit.

S102: providing a packaging substrate, wherein the packaging substrate includes a third surface and a fourth surface that are disposed oppositely, and the third surface of the packaging substrate is formed with a groove and a soldering opening.

In this embodiment, a conductive structure is disposed inside the packaging substrate, and conductive structures are provided on two opposite surfaces of the packaging substrate. In particular, the third surface and the device wafer are oppositely disposed, and the third surface is formed with grooves and soldering openings. The specific material of the packaging substrate is not limited in this embodiment. Alternatively, the material for the packaging substrate may be resin or ceramic, including all types of packaging substrates that may be used for package, such as metal packaging substrates.

It should be noted that the groove is set corresponding to the chamfered position in the subsequent processes. Therefore, in this embodiment, the position of the groove on the packaging substrate is arranged according to the edge of the device wafer to be soldered. And, the width of the groove is not limited in this embodiment, the width and a width of the chamfer may be arranged to a ratio of 1:1 or a ratio of 1:1.5 according to actual requirements, which is not limited in this embodiment.

S103: mounting the first surface of the device wafer opposite to the third surface of the packaging substrate, and the soldering opening is soldered with the electrical pads, so that the groove is aligned with the chamfered portion.

It should be noted that in this embodiment, the specific process of soldering the device wafer and the packaging substrate is not limited, wherein the ball-mounting method may be used, or the ball-mounting method may not be used for soldering.

Figure 9:
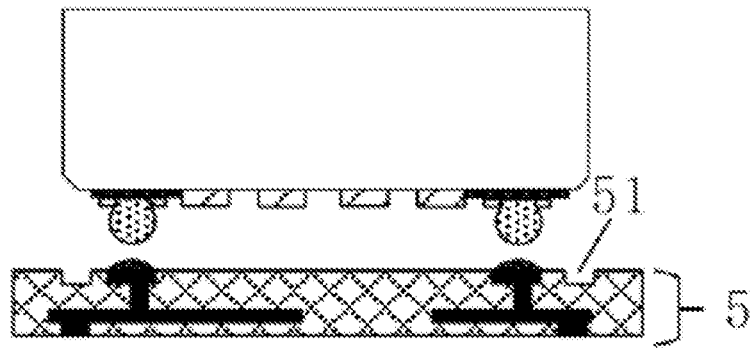

The ball-mounting method includes: arranging a metal layer and a barrier protection layer (as UMB) on the electrical pads of the device wafer, then mounting balls on the device wafer and soldered, printing the solder paste on the soldering opening of the packaging substrate, and aligning the ball-mounting position on the device wafer with the electrical pads on the packaging substrate. As shown in FIG. 9, the packaging substrate 5 is provided with the solder paste, and the device wafer 1 is provided with soldered balls, wherein after the above two are aligned and adhered to each other for sending into a tin stove, the device wafer will be aligned with the packaging substrate to complete the soldering.

Figure 10:
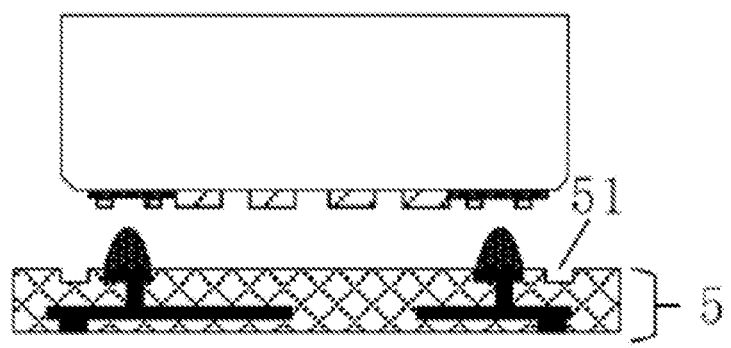

The non-ball-mounting method includes: manufacturing a passivation layer on the soldering opening of the packaging substrate 5, then etching to also manufacture the soldering opening on the packaging substrate 5 into electrical pads of the SMD structure, and then printing the solder paste on the soldering opening of the packaging substrate, followed by aligning the ball-mounting position on the device wafer with the electrical pads on the packaging substrate, as shown in FIG. 10, wherein the SMD soldering opening of the packaging substrate 5 is provided with the solder paste, and the electrical pads of the SMD structure of the device wafer 1 is aligned with the packaging substrate 5, and then adhering and mounting, finally sending through the tin stove for aligning the device wafer with the packaging substrate and completing the soldering.

Figure 11:
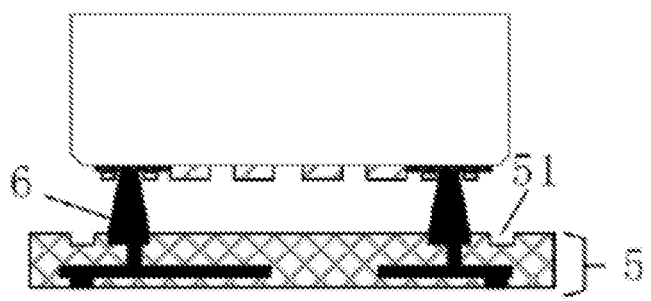

With reference to FIG. 11, one surface of the packaging substrate 5 is provided with a groove 51, wherein the groove 51 is aligned with the chamfered position of the device wafer. By printing solder paste first, a single device wafer is mounted on the packaging substrate 5, because the wiring on the device wafer is reserved for the SMD structure pads. After passing through the tin stove, the device wafer and the packaging substrate will be automatically aligned and soldered.

In this embodiment, optionally, a gap height between the device wafer and the packaging substrate ranges from 20 μm to 50 μm, including endpoint values, and the gap height of 20 μm may provide the best automatic alignment effect during soldering.

S104: providing a mask for printing, wherein the mask is embedded around the device wafer, and a side wall of the mask is a surface inclined relative to a side wall of the device wafer, the side wall of the mask is gradually away from the device wafer along the first surface toward to the second surface; a closest distance between the side wall of the mask and the side wall of the device wafer is greater than or equal to 0 and less than 5 μm.

It should be noted that a specific size of the mask is arranged according to the size of the device wafer, and the mask is embedded around the device wafer. In this embodiment, a gap is arranged between the mask and the side wall of the device wafer, so that the subsequent flow of the package resin material may be received.

Figure 12:
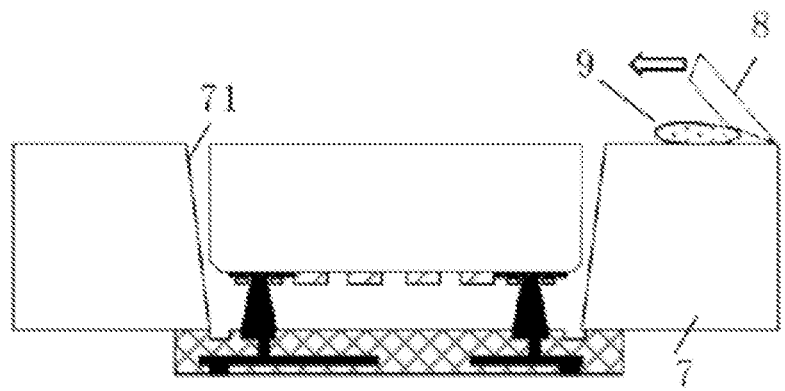

In this embodiment, the side wall of the mask is gradually away from the device wafer along the first surface toward to the second surface, specifically as shown in FIG. 12. The side wall 71 of the mask 7 is an inclined surface with respect to the side wall of the device wafer, a hollow portion of the mask forms a wedge-shaped opening, and a closest distance between the side wall of the mask and the side wall of the device wafer is greater than or equal to 0, and less than 5 μm, specifically referring to a distance in the direction perpendicular to the side wall of the device wafer, i.e., a position where the mask is closest to the device wafer in the direction perpendicular to the side wall of the device wafer; the distance from the side wall of the device wafer may be 0, or greater than 0 and less than 5 μm, wherein when the distance between the closest position of the mask to the device wafer and the side wall of the device wafer is greater than 0 and less than 5 μm, the thickness of the remaining package resin material and the accuracy of the mask must be ensured, thereby ensuring the feasibility of mass production of the process. As shown in FIG. 12, a bottom of the mask 7 is the position closest to the device wafer in the direction perpendicular to the side wall of the device wafer; even if the distance between the position and the side wall of the device wafer is 0, the gap between the side wall of the mask and the side wall of the device wafer may also leave a gap to facilitate the passage of the package resin material since the side wall of the mask is an inclined side wall.

S105: printing a package resin material, wherein the package resin material falls into the groove through the inclined surface of the mask, and a package resin is formed between the groove and the chamfer.

Figure 13:
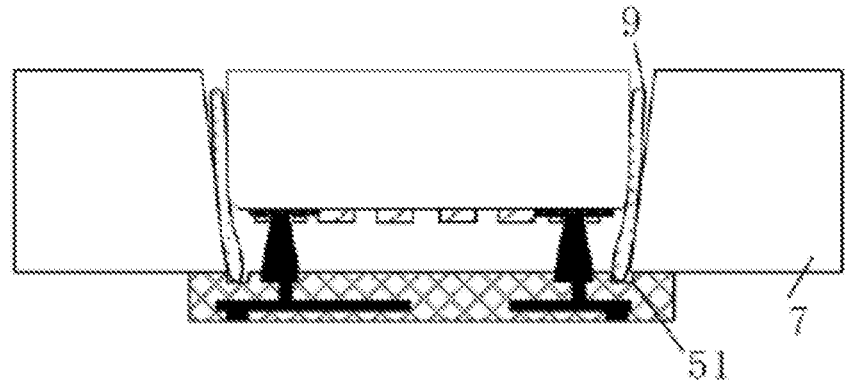

With reference to FIG. 12, the package resin material 9 is squeegeed by a squeegee 8 in the direction of the arrow in FIG. 10, as shown in FIG. 13, and the package resin material 9 falls into the groove 51 of the packaging substrate 5 through the gap between the device wafer and the mask 7.

It should be noted that optionally, in this embodiment, the package resin is a UV-curable resin material with a viscosity at room temperature ranging from 250 pa·s to 800 pa·s, including endpoint values, in order to make the package resin material difficult to diffuse between the device wafer and the packaging substrate, not to pollute the resonance circuit and not to affect the performance of the resonance circuit. Since the resin material has high viscosity, by controlling the shape of the mask and the viscosity coefficient of the resin material, the package resin material may pass through the gap between the mask and the device wafer and fall into the groove of the packaging substrate, so as not to flow in a horizontal direction and not to pollute the resonance circuit.

S106: removing the mask along from the first surface toward to the second surface, wherein the mask separates excess package resins from the side wall of the device wafer, the remaining package resins form a resin film between the chamfer and the groove, and a cavity is formed among the resin film, the device wafer and the packaging substrate.

Figure 14:
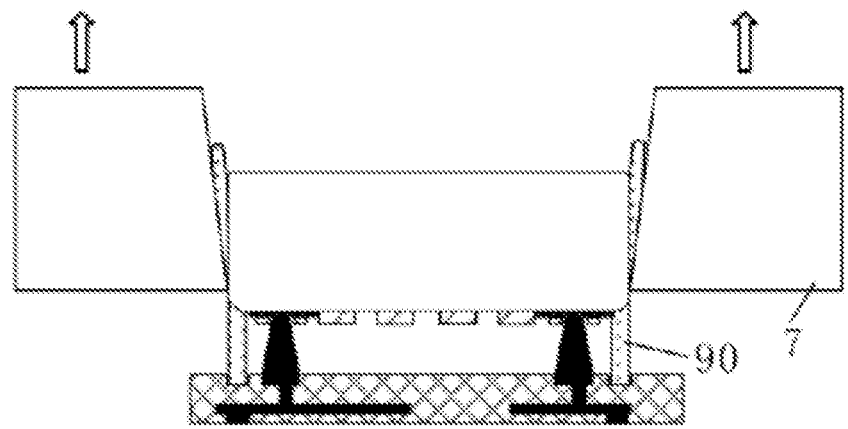

As shown in FIG. 14, the mask 7 is removed along the direction in which the first surface points to the second surface, i.e., along the direction indicated by the arrow in FIG. 14, and the position of the mask 7 closest to the side wall of the device wafer may act like a squeegee, so that the excess package resin material may be removed from the side wall of the device wafer for removing it while the remaining package resin material forming a resin film 90 between the chamfer and the groove; a closed cavity is formed among the resin film 90, the device wafer 1 and the packaging substrate 5, and the cavity is a resonance cavity of the acoustic filter.

It should be noted that after the package resin material is printed by the squeegee, the mask for printing is immediately separated, and then the package resin material will form the side wall film by casting and finally form a stable side wall liquid film by the drainage of the groove and the chamfer.

S107: curing the package resin in a position where the resin film is located.

It should be noted that curing the package resin material with high temperature will lead to higher fluidity of the package resin material, which will cause unstable sidewall shape of the package resin material. Therefore, in this embodiment, optionally, the package resin material is a UV-curable resin material, and UV light may be used to cure the remaining package resin at the position of the resin film.

Figure 15:
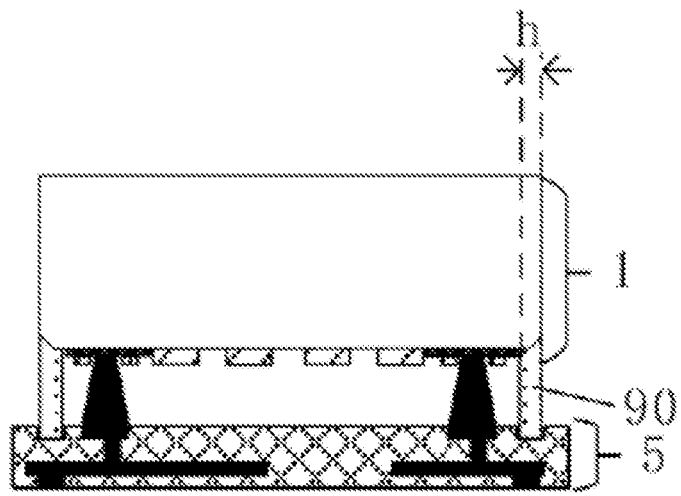

With reference to FIG. 15, the cured package resin forms a resin film 90, and a thickness of the resin film 90 in the direction perpendicular to the side wall of the device wafer, as shown by h in FIG. 15. After experiments by the inventors, it was found that the thickness h may be controlled within 5 μm to 30 μm, including endpoint values.

Figure 16:
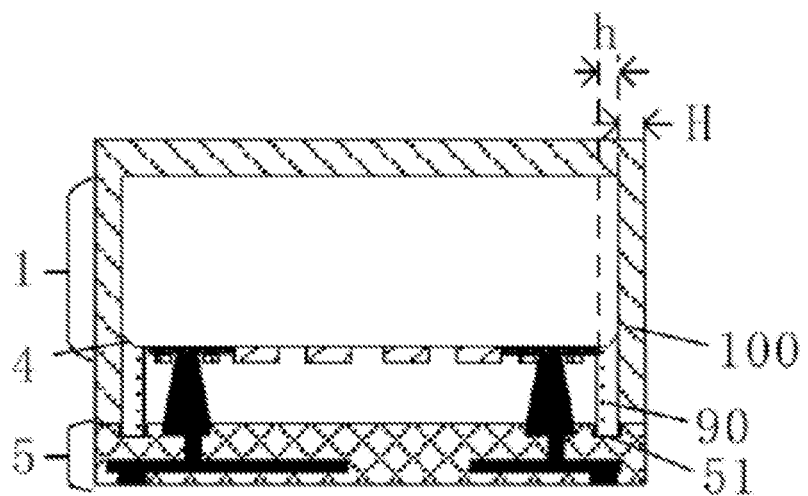

S108: As shown in FIG. 16, molding on the second surface of the device wafer, the side wall of the device wafer and a surface of the resin film facing away from the cavity, to form a closed package case.

Since the thickness of the resin film formed by the arrangement of the squeegee and the mask in this embodiment may be relatively thin, usually in the range of 5 μm to 30 μm, leading a poor stability of the resin film in actual use, a package is required to be formed by molding on the second surface of the device wafer, the side wall and a surface of the resin film facing away from the cavity.

In this embodiment, the molding material uses thermosetting molding material, which does not limit the specific process in the molding process, and may include:

standard injection molding process: injection molding conditions are molding pressure of 8 tons to 12 tons, and molding temperature is 165° C.-175° C., using standard cylindrical injection material;

standard compression molding (compression molding) injection process: molding pressure is 35 Bar, and molding temperature is also 165° C.-175° C., using standard powder injection material; and liquid molding material: molding pressure is 15 Bar-25 Bar, and molding temperature is 145° C.-155° C.

In this embodiment, due to the small thickness and strength of the sealing film, low-pressure, low-temperature and liquid molding materials are used for the injection molding process in this embodiment so as to ensure that the sealed film for the cavity has better stability and reliability. Optionally, the injection molding process specifically includes:

providing a liquid molding material;

setting a molding pressure range to 15 Bar to 25 Bar, and a temperature range to 145° C. to 155° C.; more preferably, the molding temperature is 150° C.; and molding on the second surface of the device wafer, the side wall and a surface of the resin film facing away from the cavity.

As shown in FIG. 16, the package 100 surrounds all structures except the packaging substrate 5. Since the injection molding process may also accurately control the thickness of the side wall of the package, the thickness H of the package in this embodiment may be between 50 μm and 100 μm.

The method for packaging a chip provided by the embodiment of this invention is applied to produce a chip structure with an acoustic filter, the method including: soldering a packaging substrate to a device wafer first, wherein an edge of the device wafer is chamfered, the packaging substrate is provided with a groove, the chamfered portion is aligned with the groove on the packaging substrate, and then a mask for printing is provided, a surface of the mask facing the device wafer being an inclined surface to forming a wedge-shaped opening; printing a package resin material, wherein the package resin material is filled between the chamfer and the groove, then the mask is removed a direction away from the packaging substrate, the excess package resin material is removed from the device wafer through a region with smaller opening of the wedge-shaped opening of the mask, and then the remaining package resin material is cured, and finally a resin film is formed between the device wafer and the packaging substrate and a cavity for the acoustic filter is formed among the resin film, the device wafer and the packaging substrate, followed by forming a packaging through molding, thereby completing the package of the acoustic filter chip. The resin film has a smaller thickness, and the packaging may provide higher performance protection inside the packaging.

Due to the chip structure including an acoustic filter formed by the above package method, the packaging substrate and the device wafer are connected by a resin film to form a cavity, and the resin film has a smaller thickness, which exerts effect on the dimension of the device wafer and the packaging substrate, so that the dimension of the wafer-level package may be reached; at the same time, since the resin film is formed by printing, no complicated processes are required, and the cost is similar to that for the resin film package. Therefore, the chip obtained by the package method provided by this invention meets the requirements of small size, but also has the characteristics of lower cost, and has both small size and low cost.

Based on the same inventive concept, an embodiment of this invention further provides a chip package structure. Please refer to FIG. 16. The chip package structure includes an acoustic filter structure, the structure specifically including the following technical solution:

a packaging substrate 5 and a device wafer 1 that are opposite, spaced apart and electrically connected with each other, wherein a surface of the device wafer 1 toward to a surface of the packaging substrate 5 is provided with a resonance circuit;

a surface of the packaging substrate 5 toward to the surface of the device wafer 1 is provided with a groove 51, and a projection edge of the groove 51 corresponds to a projection edge of the device wafer 1 on the packaging substrate 5;

an edge of the device wafer 1 is chamfered;

a resin film 90 for closing a spacing between the packaging substrate 5 and the device wafer 1 is provided between the groove 51 and the chamfer 4, and the resin film 90, the device wafer 1 and the packaging substrate 5 constitute a cavity; and a surface of the device wafer 1 facing away from the packaging substrate, a sidewall of the device wafer 1, a surface of the resin film 90 facing away from the cavity, and the package 100 of the packaging substrate, are encapsulated together.

In this embodiment, the electrical connection between the packaging substrate and the device wafer is not limited. Optionally, the packaging substrate 5 and the device wafer 1 are electrically connected by soldering intervals.

In this embodiment, for the final structure, through some control processes, the thickness of the resin film 90 may be in the range of 5 μm to 30 μm, including endpoint values. A thickness of a side wall of the package 100 ranges from 50 μm to 100 μm, including endpoint values.

Figure 17:
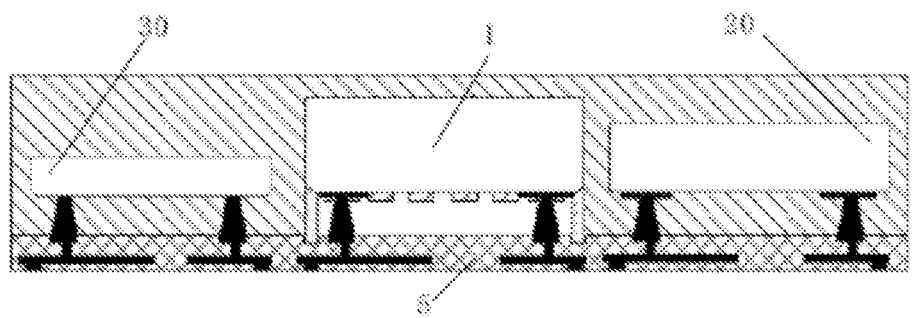
FIG. 17 is a diagram of a chip package structure according to an embodiment of this invention.

The chip package structure is a SIP (system in package) module including an acoustic filter 10, and the system in package SIP module further includes a switch, an LNA (low noise amplifier) or a PA (power amplifier). As shown by 20 in FIG. 17, it may further include structures such as resistors, inductors and other passive devices 30, which is not limited in this embodiment.

In addition, the package method provided in the embodiment of this invention may also package a device wafer structure with a plurality of acoustic filters at the same time, thereby obtaining a package structure with a plurality of acoustic filters, including 2-in-1, 3-in-1, 4-in-1 and other multi-in-one acoustic filter products, and multiplexer products such as duplexers, quadplexers, hexaplexers, such that the smallest product structure and the best performance are directly realized.

Due to the above chip package method in the above embodiments, the chip package structure provided by the embodiment of this invention may directly utilize the existing process and equipment, and has exist materials for mass production, suitable for the package of all acoustic filter types (SAW and BAW all types), which being suitable for the package of single or multiple acoustic filters, as well as facilitating the package of RF front-end module (SIP module) including acoustic filters required by various cellular terminals. The cellular terminals include 2G/3G/4G/5G mobile phones, Wi-Fi, Pad, smart watches, IOT, automobiles and other terminal devices in wireless terminal applications.

The chip package structure provided by the embodiment of this invention is obtained by packaging using the chip package method of the above embodiments, wherein the packaging substrate and the device wafer are connected by a resin film to form a cavity, and the resin film has a smaller thickness, which exerts effect on the dimension of the device wafer and the packaging substrate, so that the dimension of the device wafer-level package may be reached; at the same time, since the resin film is formed by printing, no complicated processes are required, and the cost is similar to that for the resin film package. Therefore, the chip obtained by the package method provided by this invention meets the requirements of small size, but also has the characteristics of lower cost, and has both small size and low cost.

It should be noted that each embodiment in the specification is described in a progressive manner, the emphasis of each embodiment is put on explaining the difference from other embodiments and the same or similar parts of each embodiment may refer to each other.

It is to be explained that the relationship terms, such as "first" and "second", are used herein only for distinguishing one entity or operation from another entity or operation but do not necessarily require or imply that there exists any actual relationship or sequence of this sort between these entities or operations. Furthermore, terms "comprising", "including" or any other variants are intended to cover the non-exclusive including, thereby making that the merchandise or device comprising a series of elements comprise not only those elements but also other elements that are not listed explicitly or the inherent elements to the merchandise or device. In the case of no more limitations, the element limited by the sentence "comprising a . . . " does not exclude that there exists another same element in the merchandise or device comprising the element.

The above description of the disclosed embodiments enables those skilled in the art to implement or use this invention. Various modifications on the embodiments are evident to those in the art, and the principle defined in this invention can be realized in other embodiments without departing from the scope or spirit of the invention. Therefore, this invention is not limited to the disclosed embodiments, but conforms to the widest scope that is consistent with the principle and novel characteristics of the invention.

What is claimed is:

1. A method for packaging a chip, the chip comprising an acoustic filter, the method comprising:
    providing a device wafer, wherein the device wafer comprises a first surface and a second surface that are disposed oppositely, the first surface of the device wafer is formed with a resonance circuit and electrical pads of the acoustic filter, and an edge of the device wafer is chamfered;
    providing a packaging substrate, wherein the packaging substrate comprises a third surface and a fourth surface that are disposed oppositely, and the third surface of the packaging substrate is formed with a groove and a soldering opening;
    mounting the first surface of the device wafer opposite to the third surface of the packaging substrate, and soldering the soldering opening with the electrical pads, so that the groove is aligned with the chamfered portion;
    providing a mask for printing, wherein the mask is embedded around the device wafer, and a side wall of the mask is a surface inclined relative to a side wall of the device wafer, the side wall of the mask is gradually away from the device wafer along the first surface toward to the second surface; a closest distance between the side wall of the mask and the side wall of the device wafer is greater than or equal to 0 and less than 5 μm;
    printing a package resin material, wherein the package resin material falls into the groove through the inclined surface of the mask, and resin film is formed between the groove and the chamfer;
    removing the mask along from the first surface toward to the second surface, wherein the mask separates an excess package resin material among the package resin material from the side wall of the device wafer, a remaining package resin material among the package resin material forms the resin film between the chamfer and the groove, and a cavity is formed among the resin film, the device wafer and the packaging substrate;
    curing the remaining package resin material in a position where the resin film is located; and
    molding on the second surface of the device wafer, the side wall of the device wafer and a surface of the resin film facing away from the cavity, to form a closed package case.

2. The method for packaging a chip according to claim 1, wherein the step of providing a device wafer comprises:
    providing a device wafer substrate;
    fabricating multiple acoustic filter units on a surface of the device wafer substrate, each of the acoustic filter units comprising resonance circuits and electrical pads;
    etching a cutting groove around each of the acoustic filter units, the cutting groove being wider than a dicing blade; and
    dicing the device wafer substrate into a single device wafer along the cutting groove, an edge of a surface of the single device wafer provided with the resonance circuits being chamfered.

3. The method for packaging a chip according to claim 2, wherein the method further comprises:
    forming a passivation layer on the electrical pads; and
    etching the passivation layer, and forming an opening on the electrical pads for receiving a solder paste in a soldering process, so that the electrical pads of the device wafer is automatically aligned with the soldering opening of the packaging substrate according to a target position to avoid the flow of the solder paste.

4. The method for packaging a chip according to claim 1, wherein the package resin is a UV-curable resin material with a viscosity at room temperature ranging from 250 pa.s to 800 pa.s, including endpoint values.

5. The method for packaging a chip according to claim 4, wherein the step of curing the package resin in a position where the resin film is located, comprises:
    curing the package resin in a position where the resin film is located using a UV light.

6. The method for packaging a chip according to claim 1, wherein molding on the second surface of the device wafer, the side wall of device wafer, and a surface of the resin film facing away from the cavity comprises:
    providing a liquid molding material;
    setting a molding pressure range to 15Bar to 25Bar, and a temperature range to 145° C. to 155° C.; and
    molding on the second surface of the device wafer, the side wall of the device wafer and a surface of the resin film facing away from the cavity.

* * * * *